United States Patent [19]
Krivosheev et al.

[11] 3,995,105
[45] Nov. 30, 1976

[54] APPARATUS FOR AUTOMATIC MEASUREMENT OF THE VIDEO-SIGNAL-TO-NOISE RATIO IN A TELEVISION CHANNEL

[76] Inventors: Mark Iosifovich Krivosheev, ulitsa Shukhova 18, kv. 29; Rudolf Lvovich Marein, Dukhovskoi pereuok 20, korpus 2, kv. 43; Alexandr Alexandrovich Avseevich, Chistye prudy 12, korpus 5, kv. 13; Jury Borisovich Zverev, ulitsa Demyana Bednogo 17, korpus 1, kv. 73, all of Moscow, U.S.S.R.

[22] Filed: Nov. 28, 1975

[21] Appl. No.: 636,226

Related U.S. Application Data

[63] Continuation-in-part of Ser. No. 576,580, May 12, 1975, which is a continuation of Ser. No. 339,391, March 8, 1973.

[52] U.S. Cl. .............................. 178/6; 178/DIG. 4; 325/363
[51] Int. Cl.² .......................................... H04N 7/02
[58] Field of Search ............. 178/6, DIG. 4; 325/67, 325/363

[56] References Cited
UNITED STATES PATENTS

| 2,953,746 | 9/1960 | Benewicz | 178/DIG. 4 |
| 3,506,915 | 4/1970 | Harris et al. | 325/363 |
| 3,683,282 | 8/1972 | D'Amato et al. | 325/363 |
| 3,875,328 | 4/1975 | Gibson | 178/6 |

Primary Examiner—Robert L. Griffin
Assistant Examiner—Michael A. Masinick
Attorney, Agent, or Firm—Holman & Stern

[57] ABSTRACT

An apparatus for automatic measurement of the video signal-to-noise ratio in a television channel comprises a video signal pre-processing unit, the inputs thereof being connected to the outputs of a unit measuring the peak-to-peak amplitude of the video signal, a sync separator and a control unit respectively. Another output of the sync separator is connected to a series combination of the following units controlled by the control unit; a short pulse shaper, a pulse-amplitude modulator, a switch, a pulse stretcher, a means for converting the pulse amplitude to a number of pulses, a means for producing the differences between samples, an analyzer of the differences between samples, a digital function generator and a digital display. The output of the means for producing the differences between samples is connected to one of the inputs of the unit measuring the peak-to-peak amplitude of the video signal, another input of which is coupled by way of the video signal pre-processing unit to the input of the pulse-amplitude modulator, another output of the unit measuring the peak-to-peak amplitude of the video signal being connected to one in the inputs of the switch.

3 Claims, 10 Drawing Figures

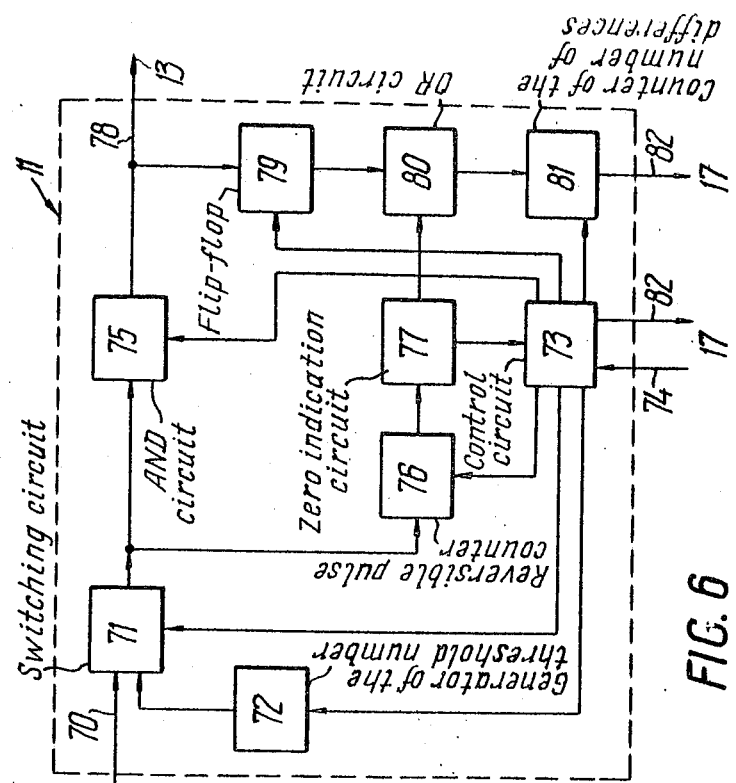
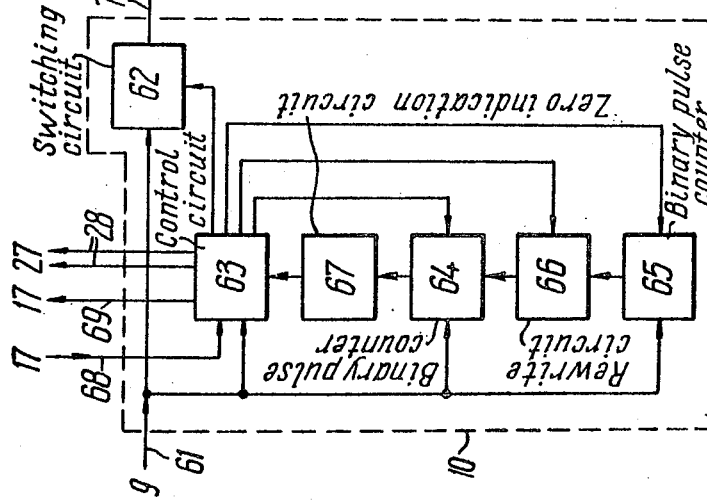
FIG. 6
FIG. 5

APPARATUS FOR AUTOMATIC MEASUREMENT OF THE VIDEO-SIGNAL-TO-NOISE RATIO IN A TELEVISION CHANNEL

CROSS REFERENCES TO RELATED PATENT APPLICATIONS IF ANY

This application is a continuation-in-part patent application of Ser. No. 576,580 filed May 12, 1975 which in its turn is a Rule 60 continuation application of Ser. No. 339,391 filed Mar. 8, 1973.

BACKGROUND ON THE INVENTION

The invention relates generally to television measuring apparatuses and more particularly it relates to an apparatus for automatic measurement of the video signal-to-noise ratio in a television channel.

There are apparatuses known in the art for automatic measurement of the video signal-to-noise ratio in a television channel, their operation being based on amplitude modulation of short pulses by noise contained in the video signal and on subsequent processing of modulated short pulses to determine the r.m.s. value of the noise.

The prior art apparatus for automatic measurement of the video-signal-to-noise ratio in a television channel comprises a unit measuring the peak-to-peak amplitude of the video signal, one input of which is fed with the video signal and which is controlled by a control unit and a serially connected sync separator, one output of which is connected with another input of the unit measuring the peak-to-peak amplitude of the video signal and to the input of which is applied a video signal, a short pulse shaper and an pulse amplitude modulator to modulate short pulses with the video signal, which is coupled to a pulse stretcher the output of which is electrically coupled to the input of a function generator, the output of the latter being coupled through an analog-to-digital converter to the input of a digital display, the other input of which is connected to the output of the control unit, the pulse stretcher being electrically coupled to the function generator by means of a filter.

The disadvantage of the existing apparatus for automatic measurement of the video signal-to-noise ratio in a television channel is that a filter is connected to the input of the function generator to convert the stretched short pulses into a continuous signal, which after square-law detection, integration and logarithmic conversion carried out by the analog method in the function generator is reconverted to a pulse form in the analog-to-digital converter. Therefore the noise being measured is subjected to a triple conversion a continuous form at the input of the apparatus — a discrete form at the output of the pulse amplitude modulator — a continuous form at the filter output — a discrete form at the output of the analog-to-digital converter. Such triple conversion plus the analog function conversion increases the conversion error and consequently, considerably reduces the accuracy of noise measurement.

Another disadvantage of the prior art apparatus is that in the noise measurement cycle it fails to adequately cancel the video signal and suppress various types of interference, including low-frequency power supply hum, line frequency interference and its harmonies and spurious signals of the pick-up tubes. This considerably reduces the resulting measurement accuracy, especially when the noise level is measured in the picture signal.

Still another disadvantage of the prior art apparatus for automatic measurement of the video signal-to-noise ratio in a television channel is that the video signal containing the noise being measured is applied to the input of the pulse amplitude modulator either directly or through a weighing filter which attenuates the noise. This results in the low sensitivity of the entire apparatus and thereby limits the measurement range towards the large video signal-to-noise ratios, i.e. low noise levels.

The prior art apparatus is also disadvantageous in that the noise measurement performed by this apparatus is not free from the effect of sharp variations of the video signal levels which occur when the picture brightness or the scene is abruptly changed. This considerably decreases the accuracy with which the noise level is measured in the video signal corresponding to a moving picture.

SUMMARY OF THE INVENTION

It is therefore an object of the invention to provide an apparatus for automatic measurement of the video signal-to-noise ratio in a television channel wherein the noise contained in the video signal is subjected to one conversion — from the continuous to the discrete form and subsequently the noise samples are directly digitally processed to determine the r.m.s. value of the noise, so as to make it possible to decrease the conversion error and obtain a much higher accuracy of noise measurement.

It is still another object of the invention to provide an apparatus wherein frame-to-frame correlation of the video signal is used to separate the noise being measured from the video signal corresponding to a moving picture and to suppress the power supply hum and all other types of interference correlated with the video signal, so as to considerably improve the accuracy of noise measurement.

It is yet another object of the invention to provide an apparatus wherein the video signal containing the noise being measured is pre-processed before it is applied to the input of a pulse amplitude modulator, so as to markedly raise the sensitivity of the entire apparatus and extend the measurement range towards larger video signal-to-noise ratios, i.e. low noise levels.

The objects of the present invention also include the provision of an apparatus wherein noise measurement is not affected by sharp variations of the video signal level which occur when the picture brightness or the scene is abruptly changed and so as to improve still more the accuracy with which noise level is measured in the video signal corresponding to a moving picture.

With these and other objects in view an apparatus for automatic measurement of the video signal-to-noise ratio in a television channel comprises a unit measuring the peak-to-peak amplitude of the video signal, a first input of which is adapted to be fed with the video signal, the unit being controlled by a control unit, and a serially connected sync separator, one output of which is connected to another input of the unit measuring the peak-to-peak amplitude of the video signal and to the input of which is supplied a video signal, a short pulse shaper and a pulse amplitude modulator for modulating short pulses with the video signal, the modulator being connected to a pulse stretcher, the output of which is electrically coupled to the input of a function generator, the output of the generator being connected to the input of a digital display, the other input of which is connected to the output of the control unit, and, according to the invention, the pulse stretcher is electrically coupled to the function generator by means of a serially connected means for converting the pulse amplitude to the number of pulses and a means for producing the differences between the samples wherein each next sample is subtracted from the previous one, while the function generator comprises a serially connected digital squarer, a digital integrator and a digital logarithmic circuit, the inputs of which are connected to the respective outputs of the control unit, the output of the digital logarithmic circuit is connected to the input of the digital display, while the input of the digital squarer is electrically coupled to the output of the means for producing the differences between samples, the other output of which is connected to the third input of the unit measuring the peak-to-peak amplitude of the video signal, the other inputs of the pulse stretcher, the means for converting the pulse amplitude to the number of pulses and the means for producing the differences between samples being connected to the outputs of the control unit, the input of which is connected to the second output of the sync separator.

The apparatus preferably comprises a video signal pre-processing unit, one input of which is connected to the third output of the sync separator, the second input of which is connected to the first output of the unit measuring peak-to-peak amplitude of the video signal so as to provide separation of the noise packets from the video signal and their amplification, and the output of which is connected to the second input of the pulse amplitude modulator so as to provide application of the noise packets to the input of the modulator, while the second output of the unit measuring the peak-to-peak amplitude of the video signal is coupled with the pulse stretcher through a switch, the second input of which is connected to the output of the pulse amplitude modulator and the third input of which is connected to the output of the control unit, the output of the latter being also connected to the third input of the video signal pre-processing unit.

The means for producing the differences between samples is preferably electrically coupled to the digital squarer of the function generator by means of an analyzer of the differences between samples, the second output of which and the third output of the means for producing the differences between samples being connected to the inputs of the control unit, the output of which is connected to the second input of the analyzer of the differences between samples so as to make possible automatic measurement of the video signal-to-noise ratio on a moving picture.

The advantage of the apparatus for automatic measurement of the video signal-to-noise ratio in television channel described herein is in that the video signal to-noise-ratio can be measured with a high accuracy using the same digital method both in the television channel of a communication link and in the video channel of a television station in the course of transmission of still and moving television pictures.

BRIEF DESCRIPTION OF THE DRAWINGS

The invention will be better understood from the following description of its specific embodiment when read in conjunction with the accompanying drawings, in which:

FIG. 5 is a functional diagram of a means for producing the differences between samples comprised in the apparatus, according to the invention;

FIG. 6 is a functional diagram of an analyzer of the differences between samples comprised in the apparatus, according to the invention;

DESCRIPTION OF THE PREFERRED EMBODIMENT

Figure 1:
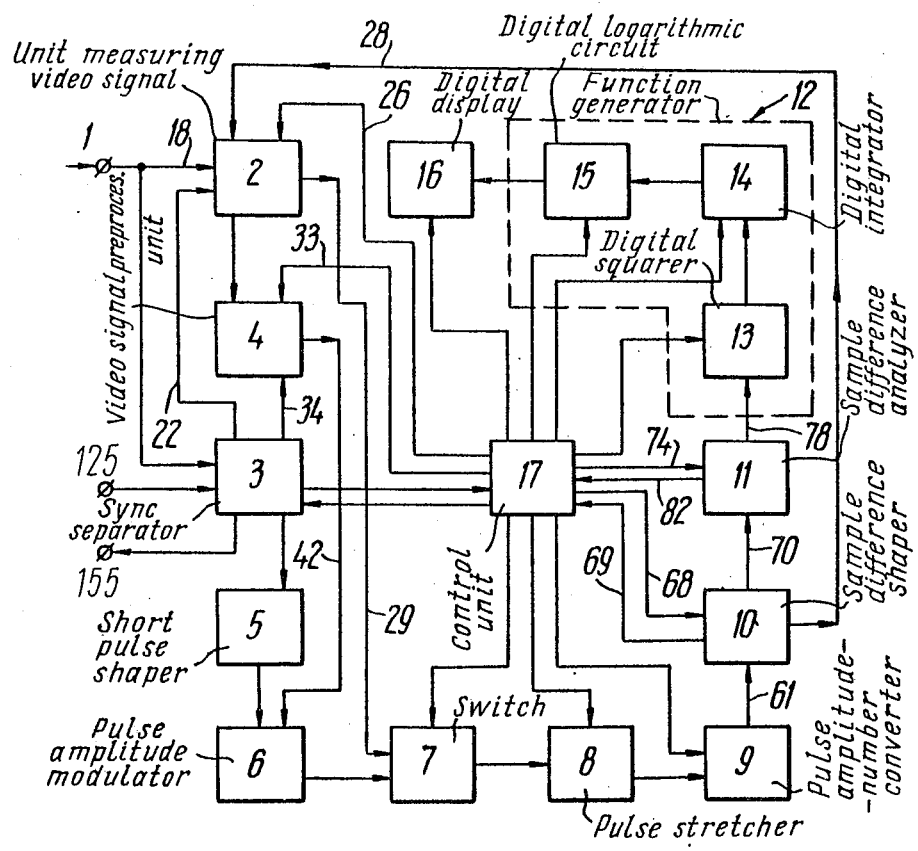
FIG. 1 is a block diagram of an apparatus for automatic measurement of the video signal-to-noise ratio in a television channel, according to the invention.

The block diagram of the apparatus for automatic measurement of the video signal-to-noise ratio in a television channel is shown in FIG. 1. An input 1 of the apparatus is connected to the first inputs of a unit 2 measuring the peak-to-peak amplitude of the video signal and a sync separator 3 using a known circuit for separating frame sync pulses and sync pulses of any lines from the video signal. The first output of the sync separator 3 is connected to the second input of the unit 2 measuring the peak-to-peak amplitude of the video signal, the first output of which is connected to the first input of a video signal pre-processing unit 4. The second input of the video signal pre-processing unit 4 is connected to the second output of the sync separator 3, the third output of which is connected to the input of a short pulse shaper 5 using a known circuit with a blocking oscillator. The output of the short pulse shaper 5 is connected to the first input of a pulse amplitude modulator 6, the second input of which is connected to the output of the video signal pre-processing unit 4. The output of the pulse amplitude modulator 6 is connected to the first input of a switch 7 made in the form of an electromagnetic relay, the second input of which is connected to the second output of the unit 2 measuring the peak-to-peak amplitude of the video signal. The output of the switch 7 is connected to a series combination of a pulse stretcher 8 made in the form of a peak detector with resetting, a means 9 for converting the pulse amplitude to the number of pulses and a means 10 for producing the differences between samples. The first output of the means 10 for producing the differences between samples is connected to the input of an analyzer 11 of the differences between samples, while the other output is connected to the third input of the unit 2 measuring the peak-to-peak amplitude of the video signal. The output of the analyzer 11 of the differences between samples is connected to the input of a function generator 12 comprising a series combination of a digital squarer 13 using a known digital circuit for squaring the number of pulses, a digital integrator 14 using a known adder accumulator arrangement and a digital logarithmic circuit 15 made in the form of a conventional decoder matrix. The output of the function generator 12 is connected to the input of a digital display 16 using digital indicator tubes with decimal indicator. The outputs of a control unit 17 are connected to the inputs intended to receive control pulses of the unit 2 measuring the peak-to-peak amplitude of the video signal, the sync separator 3, the video signal pre-processing unit 4, the switch 7, the pulse stretcher 8, the means 9 for converting the pulse amplitude to the number of pulses, the means 10 for producing the differences between samples the analyzer 11 of the differences between samples the digital square 13, the digital integrator 14, the digital logarithmic circuit 15 and the digital display 16. The inputs of the control unit 17 are connected respectively to the fourth output of the sync separator 3, the third output of the means 10 for producing the differences between samples and the second output of the analyzer 11 of the differences between samples.

Figure 2:
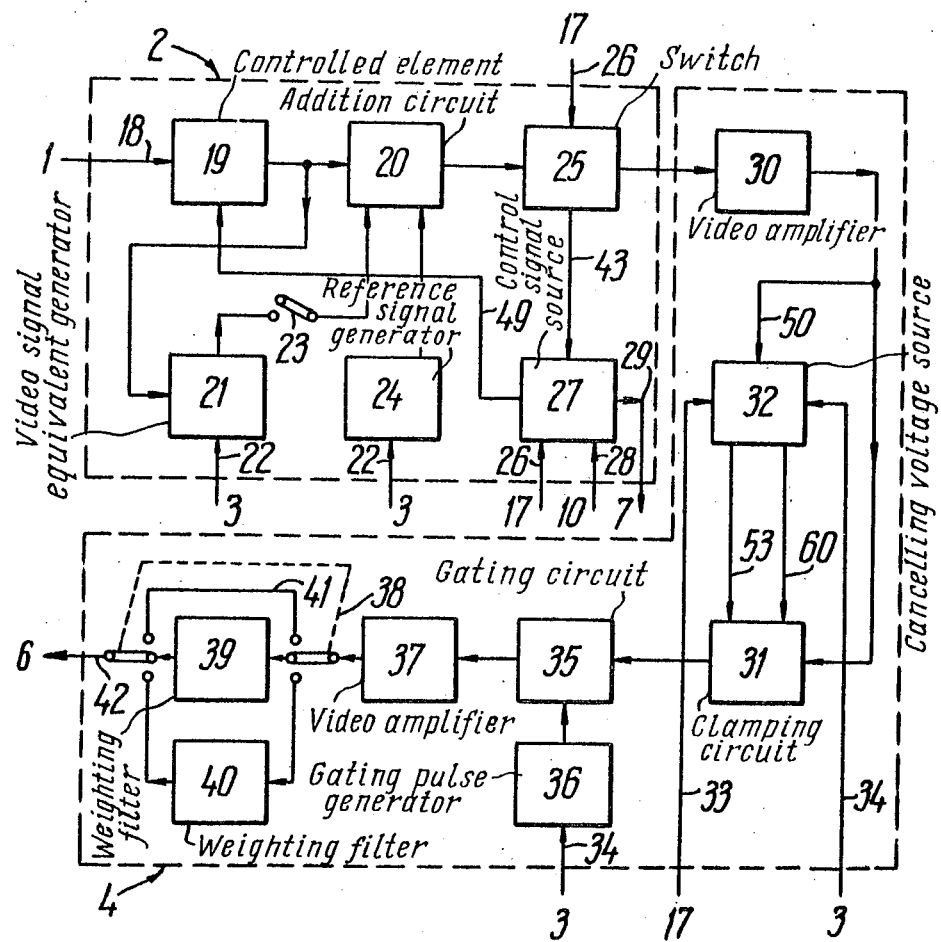
FIG. 2 is a block diagram of a unit measuring the peak-to-peak amplitude of the video signal and a video signal pre-processing unit comprised in the apparatus, according to the invention.

The block diagram of the unit 2 measuring the peak-to-peak amplitude of the video signal and of the video signal pre-processing unit 4 is shown in FIG. 2. An input bus 18 is connected to the input 1 of the apparatus and to the first input of a controlled element 19 made in the form of a conventional variable-gain amplifier. The output of the controlled element 19 is connected to the first inputs of an addition circuit 20 and a video signal equivalent generator 21 using a known circuit for producing pulses from a D.C. voltage which results from the detection of the video signal and is equal to the peak-to-peak amplitude of the video signal between the reference black and white levels, i.e. is equivalent to the video signal as regards its peak-to-peak amplitude (see for example, in "Electronic measurements and instrumentation" edited by B. M. Oliver and J. M. Cage, New York, McGraw-Hill, 1971, No. 71-124141 (Library of Congress Catalog Card Number), page 249 Section 8.9 "Peak-to-Peak Detection" and in "Television Engineering Handbook", D. G. Fink, Editor-in-Chief, 1st Edition, New York, McGraw-Hill, 1957, No. 55-11564, page 11-42, Section 11.1002 "Design of Peak Rectifier D.C. Restorers"). The second input of the video signal equivalent generator 21 is connected by a bus 22 to the first output of the sync separator 3, the output of the generator 21 being coupled through a toggle switch 23 to the second input of the addition circuit 20. The third input of the addition circuit 20 is connected to the output of a reference signal generator 24 using a known circuit for producing pulses from a D.C. reference voltage. The input of the reference signal generator 24 is also connected by the bus 22 to the first output of the sync separator 3. The output of the addition circuit 20 is connected to the first input of a switch 25 made in the form of an electromagnetic relay. The other input of the switch 25 is connected by bus 26 to the output of the control unit 17. The first output of the switch 25 is connected to the first input of a control signal source 27, the second input of which is connected by the bus 26 to the output of the control unit 17, the third input of the source being connected by a bus 28 to the second output of the means 10 for producing the differences between samples. The first output of the control signal source 27 is connected by an output bus 29 to the second input of the switch 7, the second output of the source 27 being connected to the second input of the controlled element 19.

The second output of the switch 25 is connected to the input of a video amplifier 30 of the video signal pre-processing unit 4. The output of the video amplifier 30 is connected to the first inputs of a clamping circuit 31 and a cancelling voltage source 32. The second input of the source 32 is connected by a bus 33 to the output of the control unit 17 and the third input is connected by a bus 34 to the second output of the sync separator 3. The first and second outputs of the cancelling voltage source 32 are respectively connected to the second input and the third input of the clamping circuit 31, the output of which is connected to the first input of a gating circuit 35 using a known circuit of a pedestal-compensating gate. The second input of the gating circuit 35 is connected to the output of a gating pulse generator 36 using a known monostable multivibrator arrangement, the input of which is connected by the bus 34 to the second output of the sync separator 3. The output of the gating circuit 35 is connected to the input of a video amplifier 37 the output of which may be connected through a double-pole three-way switch 38 either to the input of a weighting filter 39, the input of a weighting filter 40 or to a bus 41, depending on the type of operation selected. The frequency response characteristic of the known weighting filter 39 is such as to take into account the peculiarities of the visual perception of noise on a black-white (monochrome) television picture; the frequency response characteristic of the known weighing filter 40 takes into account of peculiarities of the visual perception of noise on a color picture [see, for example, C.C.J.R. (International Radio Consultative Commitee), Documents of the 11th Plenary Assembly; recomendation 421-1 and 451, Oslo, 1966; Volume V. Sound Broadcasting, Television; Published by the International Telecommunication Union, Geneva, 1967, pages 81–82 and FIGS. 17, 18 and 19. ] The bus 41 is used to by-pass the weighting filters 39 and 40, the outputs of the filters together with the bus 41 being connected to an output bus 42 also by means of the double-pole switch 38. The output bus 42 is connected to the second input of the pulse amplitude modulator 6.

Figure 3:
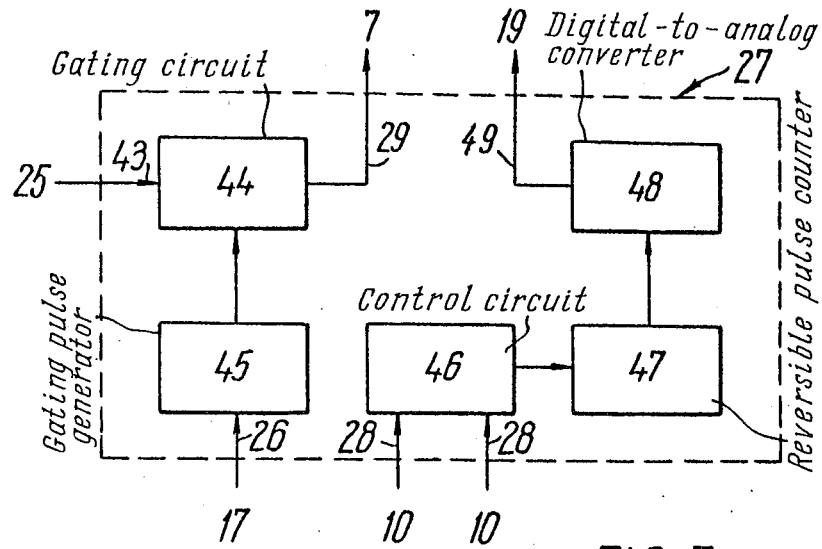
FIG. 3 is a functional diagram of a control signal source of the unit measuring the peak-to-peak amplitude of the video signal comprised in the apparatus, according to the invention.

The functional diagram of the control signal source 27 of the unit 2 measuring the peak-to-peak amplitude of the video signal is shown in FIG. 3. An input bus 43 is connected to the first output of the switch 25 and to the first input of a gating circuit 44 the second input of which is connected to the output of a gating pulse generator 45 using a known monostable multivibrator arrangement. The input of the gating pulse generator 45 is connected by the bus 26 to the output of the control unit 17. The output of the gating circuit 44 is connected by the output bus 29 to the second input of the switch 7. The second output of the means 10 for producing the differences between samples is connected by the bus 28 to the first and second inputs of a control circuit 46 the output of which is connected to the input of a reversible pulse counter 47. The output of the reversible pulse counter 47 is connected to the input of a digital-to-analog converter 48 using a known circuit for converting the number of pulses into a D.C. voltage. The output of the digital-to-analog converter 48 is connected by an output bus 49 to the second input of the controlled element 19.

Figure 4:
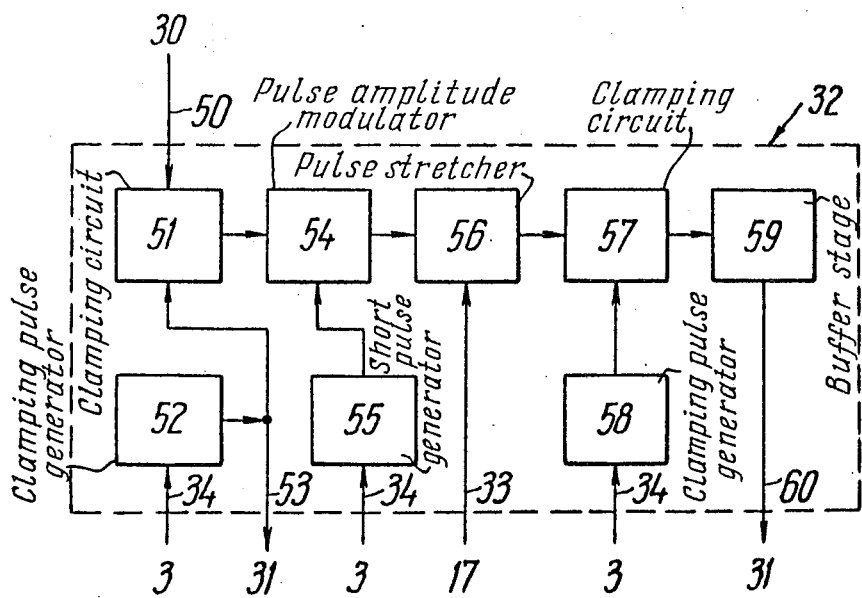
FIG. 4 is a functional diagram of a cancelling voltage source of the video signal pre-processing unit comprised in the apparatus, according to the invention.

The functional diagram of the cancelling voltage source 32 (FIG. 2) of the video signal pre-processing unit 4 is shown in FIG. 4. The input bus 50 is connected to the output of the video amplifier 30 and to the first input of a clamping circuit 51 the second input of which is connected to the output of a clamping pulse generator 52 using a known monostable multivibrator arrangement (see for example, B. B. Mitchell, "Semiconductor pulse circuits with experiments", Holt, Rinehart and Winston, Inc., New-York, 1970, No. 78-100386, Chapter 5 "Clamper Circuits" and Chapter 12 "Monostable Multivibrator"). The output of the clamping pulse generator 52 is also connected by an output bus 53 to the second input of the clamping circuit 31 of the video signal pre-processing unit, while the input of the clamping pulse generator 52 is connected by the bus 34 to the second output of the sync separator 3. The output of the clamping circuit 51 is connected to the first input of a pulse amplitude modulator 54, the second input of which is connected to the output of a short pulse generator 55 using a known blocking-oscillator arrangement [see for example, O. H. Davic, "The Elements of Pulse Techniques", New York, Reinold Publish. Corp., 1964, page 45, Section "The Blocking Oscillator" and on page 48, Section "Nanosecond Blocking Oscillators"]. The input of the short pulse generator 55 is also connected by a bus 34 to the second output of the sync separator 3. The output of the pulse amplitude modulator 54 is connected to the first input of a pulse stretcher 56 using a known circuit of a peak detector with resetting, the second input of which is connected by the bus 33 to the output of the control unit 17. The output of the pulse stretcher 56 is connected to the first input of another clamping circuit 57, the second input of which is connected to the output of another clamping pulse generator 58 using a known multivibrator arrangement. The input of the clamping pulse generator 58 is also connected by the bus 34 to the second output of the sync separator 3. The output of the clamping circuit 57 is connected by way of a buffer stage 59 to an output bus 60 connected to the third input of the clamping circuit 31 of the video signal pre-processing unit.

The functional diagram of the means 10 (FIG. 1) for producing the differences between samples is shown in FIG. 5. An input bus 61 is connected to the output of the means 9 for converting the pulse amplitude to the number of pulses and to the first inputs of a switching circuit 62 using the AND and OR circuits, a control circuit 63, a binary pulse counter 64 and a binary pulse counter 65. The second input of the switching circuit 62 is connected to the first output of the control circuit 63, the second and the third outputs of which are respectively connected to the second inputs of the binary pulse counters 64 and 65. The output of the binary pulse counter 65 is coupled by way of a rewrite circuit 66 to the third input of the binary pulse counter 64, the output of which is connected by way of a zero indication circuit 67 to the second input of the control circuit 63. A bus 68 is connected to the output of the control unit 17 and to the third input of the control circuit 63, the fourth output of which is connected by a bus 69 to the second input of the control unit 17, and the fifth and sixth outputs of which are connected by the bus 28 to the third input of the control signal source 27 of the unit measuring the peak-to-peak amplitude of the video signal. The seventh output of the control circuit 63 is connected to the second input of the rewrite circuit 66. The output of the switching circuit 62 is connected by an output bus 70 to the input of the analyzer 11 of the differences between samples.

The functional diagram of the analyzer 11 of the differences between samples is shown in FIG. 6. The output bus 70 of the means producing the differences between samples is connected to the first input of a switching circuit 71 which is designed as a double switch using a flip-flop and two AND circuits. The second input of the switching circuit 71 is connected to the output of a generator 72 of the threshold number of pulses which generates pulse groups with a fixed and constant number of pulses in each group. The input of the generator 72 is connected to the first output of a control circuit 73, the first input of which is coupled by a bus 74 to the output of the control unit 17. The second output of the control circuit 73 is connected to the third input of the switching circuit 71, the output of which is connected to the first inputs of an AND circuit 75 and a reversible pulse counter 76. The second input of the reversible pulse counter 76 is connected to the third output of the control circuit 73 and the output of the reversible pulse counter 76 is connected to the input of zero indication circuit 77, the first output of which is coupled to the second input of the control circuit 73. The fourth output of the control circuit 73 is connected to the second input of the AND circuit 75. The output of the AND circuit 75 is connected to an output bus 78 coupled to the input of the digital squarer 13 and to the first input of a flip-flop 79, the second input of the flip-flop being connected to the fifth output of the control circuit 73. The output of the flip-flop 79 is connected to the first input of an OR circuit 80, the second input of which is coupled to the second output of the zero indication circuit 77. The output of the OR circuit 80 is connected to the first input of a counter 81 of the number of differences in the form of a reversible pluse counter, the second input of which is coupled to the sixth output of the control circuit 73. The seventh output of the control circuit 73 is connected to the third input of the control unit 17 by a bus 82. The output of the counter 81 of the number of differences is also connected to the third input of the control unit 17 by the same bus 82.

Figure 7:
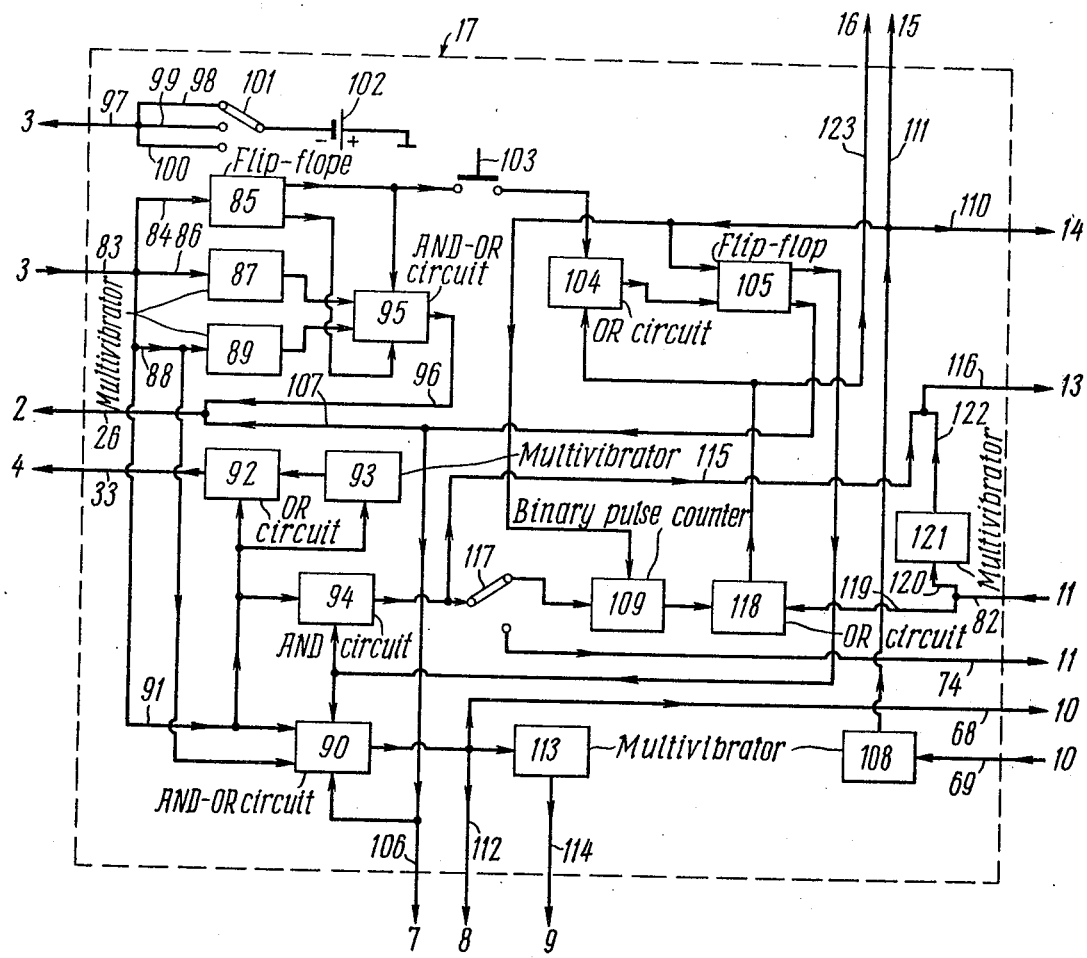
FIG. 7 is a functional diagram of a control unit comprised in the apparatus, according to the invention.

The functional diagram of the control unit 17 is shown in FIG. 7. To an input bus 83 connected to the fourth output of the sync separator 3 there are connected via a bus 84 the input of a counter flip-flop 85, via a bus 86 the input of a monostable multivibrator 87; via a bus 88 the input of a monostable multivibrator 89 and the first input a AND/OR circuit 90, via a bus 91 the first input of an OR circuit 92, the input of a monostable multivibrator 93, the first input of an AND circuit 94 and the second input of a AND-OR circuit 90. The output of the multivibrator 93 is connected to the second input of an OR circuit 92, the output of which is connected via the output bus 33 to the second input of the pulse stretcher 56 (FIG. 4) of the cancelling voltage source 32 (FIG. 2) of the video signal pre-processing unit 4 (FIG. 1). The outputs of the multivibrators 87 (FIG. 7) and 89 are connected to the first and second inputs of an AND-OR circuit 95, respectively, while the first and second outputs of the flip-flop 85 are connected to the third and fourth inputs of this circuit, respectively. The output of the AND-OR circuit 95 is connected via a bus 96 to the output bus 26 connected to the input of the gating pulse generator 45 (FIG. 3) of the control signal source 27 (FIG. 2) of the unit 2 (FIG. 1) measuring the peak-to-peak amplitude of the video signal. To an output bus 97 connected to the second input of the sync separator 3 there are connected buses 98, (FIG. 7), 99 and 100. One of these buses may be connected through single pole three-way switch 101 to the negative terminal of a DC voltage source 102.

To the first output of the flip-flop 85 there is connected through contacts of a self-reset start button 103 the first input of an OR circuit 104, the output of which is connected to the first input of a reset-set flip-flop 105. The third input of the AND-OR circuit 90, an output bus 106 connected to the third input of the switch 7 (FIG. 1), a bus 107 (FIG. 7) connected via the bus 26 to the second input of the switch 25 (FIG. 2) of the unit 2 (FIG. 1) measuring the peak-to-peak amplitude of the video signal are connected to the first output of the flip - flop 105 (FIG. 7). The input of a monostable multivibrator 108 is connected to the input bus 69 connected to the fourth output of the control circuit 63 (FIG. 5) of the means 10 (FIG. 1) for producing the differences between samples. The first input of a binary pulse counter 109 (FIG. 7) (with feedback loops), the second input of the flip-flop 105, an output bus 110 connected to the second input of the digital integrator 14 (FIG. 1), an output bus 111 connected to the second input of the digital logarithmic circuit 15 are connected to the output of the multivibrator 108 (FIG. 7).

The second output of the flip-flop 105 (is connected to the second input of the AND circuit 94 and to the fourth input of the AND - OR circuit 90. An output bus 112 connected to the second input of the pulse stretcher 8 (FIG. 1), the output bus 68 connected to the third input of the control circuit 63 (FIG. 5) of the means 10 (FIG. 1) for producing the differences between samples and the input of a monostable multivibrator 113 (FIG. 7) are connected to the output of the AND - OR circuit 90. The output of the multivibrator 113 is connected via an output bus 114 to the second input of the means 9 (FIG. 1) for converting the pulse amplitude to a number of pulses.

A bus 115 (FIG. 7) connected via an output bus 116 to the second input of the digital squarer 13 (FIG. 1) is connected to an output of the AND circuit 94 (FIG. 7). Further the output of the AND circuit 94 may be connected through a single pole two-way switch 117 either to the second input of the binary pulse counter 109 or to the output bus 74 connected to the first input of the control circit 73 (FIG. 6) of the analyzer 11 (FIG. 1) of the differences between samples.

The output of the binary pulse counter 109 (FIG. 7) is connected to the first input of an OR circuit 118, the second input thereof being connected via a bus 119 to the input bus 82 connected to the output of the counter 81 (FIG. 6) of the number of differences of the analyzer 11 (FIG. 1) of the differences between samples. Further to the input bus 82, which is also connected to the seventh output of the control circuit 73 (FIG. 6) of the analyzer 11 (FIG. 1) of the differences between samples, there is connected via a bus 120 (FIG. 7) the input of a monostable multivibrator 121. The output of the multivibrator 121 is connected via a bus 122 to the output bus 116 connected to the second input of the digital squarer 13 (FIG. 1).

The second input of the OR circuit 104 (FIG. 7) and an output bus 123 connected to the second input of the digital display 16 (FIG. 1) are connected to the output of the OR circuit 118 (FIG. 7).

An apparatus for automatic measurement of the video-signal-to-noise ratio in a television channel operates as follows.

The apparatus automatically measures in decibels the ratio ($\psi$) of the peak-to-peak amplitude ($U_S$) of the video signal between the reference black and white levels to the true r.m.s. value of the noise ($U_{N\ r.m.s.}$) within the video frequency band according to the formula:

$$\psi = 20 \log \frac{U_s}{U_{N\ r.m.s.}} \qquad (db),$$

where log is the symbol of a common logarithm. The apparatus can measure the ratio of the video signal to both weighted and unweighted value of the noise.

The entire period of one measurement, i.e. the time during which one value of the measured video signal-to-noise ratio is obtained in any point of the television channel is divided into two basic cycles, namely the video signal measurement cycle and the noise measurement cycle. The duration and alternation of the cycles are set by the control unit 17 (FIG. 1) which furnishes pulses synchronizing operation of the individual units and controlling operation of the entire apparatus.

During the first cycle (that is the video signal measurement cycle) the peak-to-peak amplitude of the video signal applied to the input of the apparatus is adjusted to some fixed value, i.e. the selected peak-to-peak amplitude of the video signal between the reference black and white levels is automatically maintained. In this case the same video signal-to-noise ratio at the input of the apparatus always corresponds to the same absolute value of the noise voltage, regardless of the peak-to-peak amplitude of the video signal. Consequently, the measurement of the video signal-to-noise ratio is always performed under the similar dynamic conditions of all units.

During the first measurement cycle a video signal 124 (FIG. 8) applied to the input 1 (FIG. 1) of the apparatus comes to the input of the unit 2 measuring the peak-to-peak value of the video signal and to the input of the sync separator 3. If the video signal does not contain line and frame sync pulses (the video signal applied directly from the output of the television camera) external sync pulses are applied to a separate input 125 of the same separator 3. If the video signal contains the test line signals (Vertical interval test signal), the sync separator 3 separates from the video signal 124 (FIG. 8) the field sync pulse, the sync pulse of the test line containing a "white" pulse 126 (peak-white bar pulse) and a sync pulse of some line located within the frame blanking interval but containing no test or other auxiliary signals (the sync pulse of the line preceding the first test line). From the outputs of the sync separator 3 (FIG. 1) separated sync pulses 127 (FIG. 8) are respectively applied to the inputs of the short pulse shaper 5 (FIG. 1), the control unit 17 and the unit 2 measuring the peak-to-peak amplitude of the video signal.

The video signal 124 (FIG. 8) coming to the input bus 18 (FIG. 2) of the unit 2 measuring the peak-to-peak amplitude of the video signal is applied to the input of the controlled element 19. The controlled element 19 maintains with a high accuracy a constant peak-to-peak amplitude of the video signal equal to the selected value whereas the peak-to-peak amplitude of the video signal 124 (FIG. 8) coming to the input 1 (FIG. 1) of the apparatus and to the input of the controlled element 19 (FIG. 2) may vary within wide limits. A constant peak-to-peak amplitude of video signal is maintained with the help of an automatic gain control.

From the output of the controlled element 19 the video signal is applied to the input of the addition circuit 20 which inserts into the video signal a reference white level pulse 128 (a reference pulse) (FIG. 8) fed to one of the inputs of the addition circuit 20 (FIG. 2) from the output of the reference signal generator 24. This pulse is required for maintaining with a high accuracy a constant peak-to-peak amplitude of the video signal at the output of the controlled element 19 with the help of the control signal source 27. In this source and in the means 10 (FIG. 1) for producing the differences between samples the amplitude of the white pulse 126 (FIG. 8) is compared with the amplitude of a reference white level pulse (reference pulse) 128. The reference pulse 128 is produced in the reference signal generator 24 (FIG. 2) the input of which is fed with pulses from the output of the sync separator 3 via the bus 22. In the addition circuit 20 the reference pulse 128 (FIG. 8) is inserted in one of the video signal lines located within the frame blanking interval and containing no test or other auxiliary signals. The reference pulse 128 (may be inserted in a line preceding the first test line. The duration of the reference pulse 128 may be made equal to one-fourth of the line period.

Figure 8:
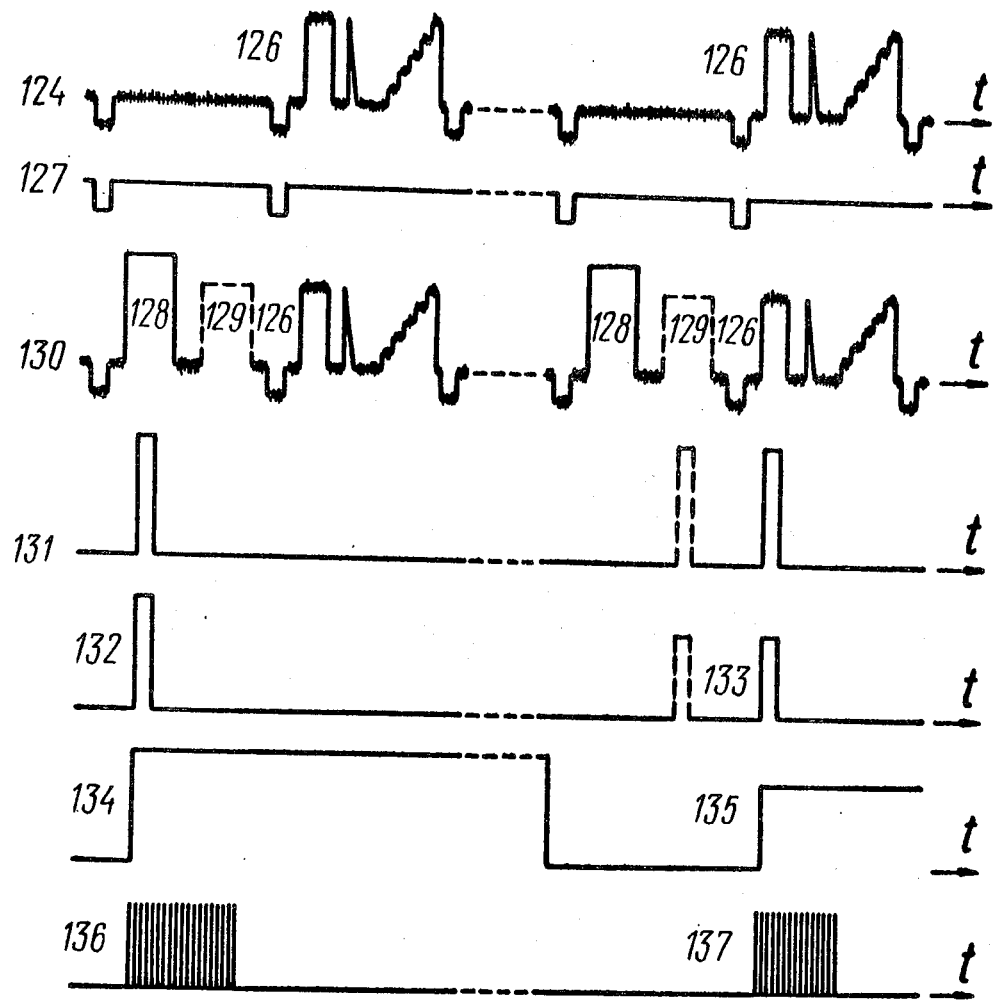
FIG. 8 shows waveforms in various circuits of the apparatus during the video signal measurement cycle, according to the invention.

If the video signal applied to the input 1 of the apparatus (FIG. 1) contains no test line signals or if the video signal-to-noise ratio is measured on the picture, apart from the reference pulse 128 (FIG. 8) the addition circuit 20 (FIG. 2) inserts in the video signal a video signal equivalent pulse 129 (FIG. 8) (equivalent pulse) applied to one of the inputs of the addition circuit 20 (FIG. 2) from the output of the video signal equivalent generator 21 through the toggle switch 23. The amplitude of the equivalent pulse 129 (FIG. 8) is equal to the peak-to-peak amplitude of the video signal between the reference black and white levels (i.e. to the peak-to-peak amplitude of the picture signal), while its duration is equal to the duration of the reference pulse 128. The pulse 129 which is a video signal equivalent as regards the peak-to-peak amplitude en- ables the peak-to-peak amplitude of the video signal to be maintained constant with a high accuracy by means of an automatic gain control in the absence of the white pulse 126 in the video signal 124. The equivalent pulse 129 is produced by a video signal equivalent generator 21 (FIG. 2) to one input of which is applied the video signal, simultaneously fed to the input of the addition circuit 20. The other input of the generator 21 is fed via the bus 22 with the output pulses of the sync separator 3. The addition circuit 20 inserts the equivalent pulse 129 (FIG. 8) in one of the video signal lines which is located in the frame blanking interval and does not contain any test or other auxiliary signals. The equivalent pulse 129 may be inserted in the same line as the reference pulse 128, as shown in FIG. 8.

From the output of the addition circuit 20 (FIG. 2) the video signal 130 (FIG. 8) with the inserted reference pulse 128 (and also with the equivalent pulse 129 if the test line signals are absent or if the video signal-to-noise ratio is measured on a picture) is applied via the switch 25 (FIG. 2) to the input of the control signal source 27. The pulses which control the switching are applied to the input of the switch 25 via the bus 26 from the output of the control unit 17. During the video signal measurement cycle, the switch 25 connects the output of the addition circuit 20 with the input of the control signal souce 27.

From the output of the addition circuit 20 the video signal 130 (FIG. 8) is applied through the switch 25 and the input bus 43 (FIG. 3) to the input of the gating circuit 44, the other input of which are fed with gating pulses 131 (FIG. 8) produced by the gating pulse generator 45 (FIG. 3). Operation of the generator 45 is controlled by the pulses coming from the output of the control unit 17 via the bus 26. The gating pulses 131 (FIG. 8) are repetitive at the field frequency and periodically, from field to field, change their position in time relative to the reference pulse 128 so that in each next field the gating circuit 44 (FIG. 3) alternately gates the reference pulse 128 (FIG. 8) and the white pulse 126 (or the equivalent pulse 129, when the test line signals are absent or the video signal-to-noise ratio is measured on a picture). The duration of the gating pulses 131 is made equal to about 7-9$\mu$s but not greater than the duration of the white pulse 126 which is in effect the shortest of all pulses (126, 128, 129) subjected to gating. Due to such a long duration of the gating pulses 131 the accuracy of the automatic gain control is rendered unaffected by the noise superimposed on the white pulse 126 in the television channel and the design of the gating circuit 44 (FIG. 3) can be simplified. The pulses 132 and 133 (FIG. 8) which are produced as a result of gating and the amplitudes of which are proportional to the amplitudes of the gated pulses 128 and 126 respectively, are applied from the output of the gating circuit 44 (FIG. 3) to the output bus 29 and then via the switch 7 (FIG. 1) to the input of the pulse stretcher 8. The pulses which control the switching are applied to the input of the switch 7 from the output of the control unit 17. During the video signal measurement cycle, the switch 7 connects the output of the gating circuits 44 (FIG. 3) to the input of the pulse stretcher 8 (FIG. 1) via the bus 29.

The pulse stretcher 8 extends the duration of the pulses 132 and 133 (FIG. 8) to the field period. The voltage across the pulse stretcher 8 (FIG. 1) is reset by a special pulse coming from the output of the control unit 17. From the output of the pulse stretcher 8 the stretched pulses 134 and 135 are applied to the input of the means 9 (FIG. 1) for converting the pulse amplitude into a number of pulses, wherein the stretched pulses are converted into pulse groups 136 and 137 (FIG. 8), respectively. The numbers of pulses in these groups are proportional to the amplitudes of converted pulses 134 and 135, respectively. From the output of the means 9 (FIG. 1) the pulse groups 136 and 137 (FIG. 8) are applied to the input of the means 10 (FIG. 1) for producing the differences between samples.

Operation of the means 10 for producing the differences between samples is explained in detail below in the paragraphs dealing with the operation of the apparatus during the noise measurement cycle. If the number of pulses in the group 137 (FIG. 8) proportional to the amplitude of the white pulse 126 is not equal to the number of pulses in the group 136 proportional to the amplitude of reference pulse 128. The means 10 (FIG.

1) produces a pulse which is applied through the bus 28 to one of the inputs of the control circuit 46 (FIG. 3) of the control signal source 27.

Depending on the sign of the difference between the amplitudes of the reference pulses 128 and the white pulse 126, the pulse coming to the input of the reversible counter 47 (FIG. 3) is added to or subtracted from the number registered in this counter. The change of unity in the number of pulses is transferred from the output of the reversible counter 47 to the input of the digital-to-analog converter 48, and a positive or negative D.C. voltage increment (depending on the sign of the difference) appears at the converter output. This increment is fed through the bus 49 to the second input of the controlled element 19 (FIG. 2) changing its gain and, consequently, causing the peak-to-peak amplitude of the video signal (including that of the white pulse 126 (FIG. 8) to change accordingly at the output of the controlled element 19 (FIG. 2).

During the subsequent field the process described above, i.e. the comparison of the amplitudes of the reference pulse 128 (FIG. 8) and the white pulse 126 and subsequent variation of the peak-to-peak amplitude of the video signal at the output of the controlled element 19 (FIG. 2) is repeated until the amplitude of the white pulse 126 (FIG. 7) becomes equal to the amplitude of the reference pulse 128. When this happens the means 10 (FIG. 1) for producing the differences between samples furnishes an "equality" pulse, which is applied from one of the outputs of the means 10 via the bus 69 to the input of the control unit 17 where these equality pulses are converted to control pulses which correspond to the termination of the video signal measurement cycle and the commencement of the noise measurement cycle. In a similar way, the amplitude of the equivalent pulse 129 (FIG. 8) is adjusted to a value equal to the amplitude of the reference pulse 128 (if the test line signals are absent or when the video signal-to-noise ratio is measured on a picture). After termination of the video signal measurement cycle no pulses are applied to the two inputs of the control circuit 46 (FIG. 3) and, therefore the number registered in the reversible counter 47 remains unchanged during the noise measurement cycle. Consequently, the D.C voltage at the output of the digital-to-analog converter 48 which is applied via the bus 49 to the input of the controlled element 19 (FIG. 2) also remains unchanged during the noise measurement cycle as does the gain of the controlled element 19.

Therefore by the time the noise measurement cycle commences the amplitude of the white pulse (or the peak-to-peak amplitude of the picture signal) at the output of the controlled element 19 is precisely equal to the selected value regardless of the peak-to-peak amplitude of the video signal at the input of the apparatus. Consequently, the noise level (in the video signal) which will be measured during the noise measurement cycle will unambiguously determines the video signal-to-noise ratio.

During the second cycle (the noise measurement cycle), the apparatus measures the true r.m.s. value of the noise voltage contained in the video signal. Measurement of the r.m.s. noise voltage is based on the ensemble averaging of the differences between noise samples obtained in the successive frames, field or lines. Depending on the section of the television channel where the video signal-to-noise ratio is to be measured the apparatus may have the following modes of operation during the noise measurement cycle:

a. measurement is made in the television channel of a communication link or in one of its sections; in this case the noise instantaneous values are sampled in the frame blanking interval once or several times per field or frame;

b. measurement is made in the television channel of a communication link with rapidly changing characteristics (a tropospheric-scatter link); in this case the noise instantaneous values may be sampled in each line blanking interval (at the back porch of the blanking pulse), which markedly reduces the measurement time and improves the measuring accuracy;

c. measurement is made at the output of a television camera or at some other point of the studio equipment; in this case the noise must be measured directly in the picture signal. The noise instantaneous values may be sampled within any portion of the picture signal in each frame.

In all modes mentioned above the r.m.s. value of the noise voltage is measured by ensemble averaging of the differences between the samples of noise instantaneous values. Besides in the mode c use is made of the frame-to-frame correlation of the picture signal.

The operation of the apparatus disclosed herein during the noise measurement cycle will be described for the mode a, i.e. for the case when the measurement is made in the communication link and the noise instantaneous values are samples in the frame blanking interval. Additionally, discussion will be made of the specific features of operation of individual units in other modes.

The video signal applied to the input 1 (FIG. 1) of the apparatus comes to the input of the unit 2 measuring the peak-to-peak amplitude of the video signal and to the input of the sync separator 3. The sync separator 3 separates from the video signal the field sync pulse and the sync pulse of the line preceding the line selected for noise measurement. This line may be one of the test lines or any other line located within the frame blanking interval (in the mode c the sync pulse may be separated from any line containing the picture signal and selected for noise measurement). From the output of the sync separator 3, the separated sync pulses are applied to the input of the control unit 17. Further, using an adjustable pulse delay the separator 3 produces from the separated sync pulses the pulses the trailing edge of which coincides in time with the beginning of the line portion in which noise is to be measured. From the output of the sync separator 3, these pulses are applied to the input of the video signal pre-processing unit 4 via the bus 34 and to the input of the short pulse shaper 5. In the video signal pre-processing unit 4 the trailing edge of the pulses triggers the gating pulse generator 36 (FIG. 2) which produces gating pulses of 3–5 μs duration while in the short pulse shaper 5 (FIG. 1) the trailing edge of the same pulses delayed by 1.5 – 2.5 μs are changed into pulses of 20 – 30 ns duration.

The video signal coming to the input bus 18 (FIG. 2) of the unit 2 measuring the peak-to-peak amplitude of the video signal is applied to the input of the controlled element 19 whose gain remains unchanged throughout the noise measurement cycle. From the output of the controlled element 19, the video signal is applied to the input of the addition circuit 20 and from the output of this circuit via the switch 25 to the input of the video amplifier 30 of the video signal pre-processing unit 4. The pulses which control the switching are applied to the input of the switch 25 from the output of the control unit 17, causing the input of the video amplifier 30 to be connected to the output of the addition circuit 20. The input of the control signal source 27 is disconnected from the output of the addition circuit 20 so that the automatic gain control remains inoperative during the entire noise measurement cycle.

The video amplifier 30 followed by the clamping circuit 31 together with the cancelling voltage source 32, the gating circuit 35 (which may be connected in series with one or several additional gating circuits) and the video amplifier 37 considerably raise the sensitivity of the apparatus, that is they extend its measurement range towards smaller noise levels (higher video signal-to-noise ratios) and improve the measurement accuracy. The video amplifier 30 performs preamplification of the video signal and its output is coupled to the input of the clamp circuit 31 and to the input of the cancelling voltage source 32.

The clamping circuit 31 holds the video signal in each line as the level of the blanking pulses, to the inputs of the clamping circuit 31 being applied the clamping pulses, also the reference voltage from the ouputs of the cancelling voltage source 32. The reference voltage is so produced in the source 32 that the video signal pedestal is cancelled at the output of the clamping circuit 31 and, consequently, at the input of the gating circuit 35. The fact that the pedestal is cancelled enbles the video signal-to-noise ratio to be measured with a high accuracy at any level of the video signal, and consequently, any brightness of the pictorial details, which is especially important when making measurements on a moving picture.

The operation of one of the possible embodiments of the cancelling voltage source 32 will be described for the mode c.

A video signal 138 (FIG. 9) applied to the input bus 50 (FIG. 2) of the cancelling voltage source 32 comes to the input of the auxiliary clamping circuit 51 (FIG. 4). The video signal 138 (FIG. 9) is also applied to the input of the main clamping circuit 31 (FIG. 2) of the video signal pre-processing unit. The clamping circuit 51 (FIG. 4) like the clamping circuit 31 (FIG. 2) holds the video signal at the level of the blanking pulses with the help of clamping pulses 139 (FIG. 9) furnished by the clamping pulse generator 52 (FIG. 4). The generator 52 is triggered by the pulses fed via the bus 34 to its input from the output of the sync separator 3. From the output of the clamping circuit 51, the video signal is applied as a modulating voltage to the input of the pulse amplitude modulator 54. The other input of the pulse amplitude modulator 54 is fed with a train 140 (FIG. 9) of paired short pulses (20 – 30 ns long) located in the same line and repetitive at the frame frequency. These pulses are produced in the short pulse generator 55 (FIG. 4) which is triggered by the pulses applied to its input via the bus 34 from the output of the sync separator 3. The first pulse of each pair of the train 140 (FIG. 9) coincides in time with the clamping interval (with the clamping pulses 139). The second pulse of each pair coincides with the video signal portion leading the video signal portion in the next line wherein the noise is to be measured by an amount precisely equal to the line period. In the pulse amplitude modulator 54 (FIG. 4) the first pulse is modulated in amplitude by the blanking level of the video signal and the second pulse, by the level of the video signal portion mentioned above and by the noise instantaneous value which coincides in time with this pulse. From the output of the pulse amplitude modulator 54 (FIG. 4) modulated pulses 141 (FIG. 9) are applied to the input of the pulse stretcher 56, the other input of which is fed via the bus 33 with resetting pulses from the output of the control unit 17. The first pulse of each pair of the modulated pulses 141 (FIG. 9) is stretched to a duration equal to the interval between the pulses of the pair, and the second pulse, to a duration equal to the interval between the second pulse and the end of the next line. Amplitude modulation and stretching of short pulses described above also take place in the pulse amplitude modulator 6 (FIG. 1) and in the pulse stretcher 8 of the main measurement channel of the apparatus. In the stretched pulses 142 (FIG. 9) the amplitude difference is equal to the sum of the video signal level (relative to the blanking level) in the portion in which the noise measurement is made and the noise instantaneous value at the instant of time coincident with the second pulse. This results from the line-to-line correlation of the video signal, the levels of which are on the average equal within the portions located in the successive lines and spaced by a line period. From the output of the stretcher 56 (FIG. 4), the stretched pulses 142 (FIG. 9) are applied to the input of the other auxiliary clamping circuit 57 (FIG. 4) which is also fed with clamping pulses 143 (FIG. 9) from the output of the clamping pulse generator 58 (FIG. 4). The generator 58 is triggered by the pulses which are applied to its input from the output of the sync separator 3 via the bus 34.

The clamping circuit 57 holds the stretched pulses 142 (FIG. 9) at the blanking level. Output pulses 144 (FIG. 9) of the circuit 57 (FIG. 4) are applied as a reference voltage to the input of the main clamping circuit 31 (FIG. 2) via the bus 60. As a result, a video signal 145 (FIG. 9) at the output of the clamping circuit 31 is held at a level of the video signal portion selected for the measurement of the noise level. In this way the video signal pedestal is cancelled at the input of the gating circuit 35 (FIG. 2).

Figure 9:
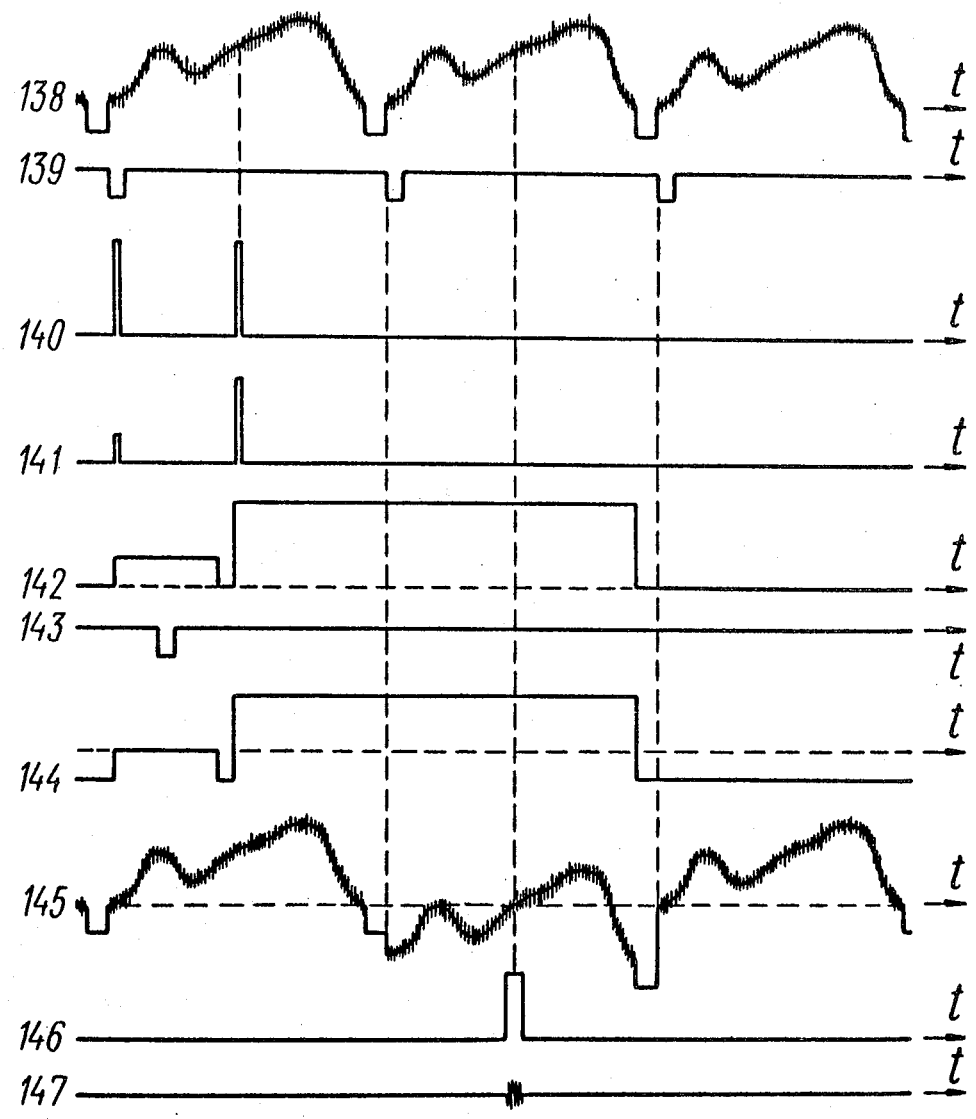
FIG. 9 shows waveforms in various circuits of the video signal pre-processing unit of the apparatus during the noise measurement cycle in the mode $c$, according to the invention.

Using gating pulses 146 which are applied via the bus 34 from the output of the sync separator 3, the gating circuit 35 separates from the video signal 145 (FIG. 9) the video signal portions of 3 – 5 μs duration which are in effect noise packets 147 (FIG. 9). Depending on the mode of operation of the apparatus the pulses 146 are repetitive at the frame frequency, field frequency or every alternate line. The processes through which the noise packets 147 (FIG. 9) produced at the output of the gating circuit 35 (FIG. 2) go in the subsequent units are essentially similar for all modes of operation a, b and c and will be described below. It should be noted that one or several gating circuits may be connected in series with the gating circuit 35 (FIG. 2) to separate noise packets of shorter duration from the noise packets 147 (FIG. 9). This enables the video signal pedestal to be cancelled more thoroughly and renders the succeeding units unaffected by the distortions in the form of overshoots which appear in the course of gating.

In the mode a when the noise level is measured in the frame blanking interval, the video signal 148 (FIG. 10) is applied from the output of the clamping circuit 31 (FIG. 2), like in the mode c described above, to the input of the gating circuit 35, to the other input of which are supplied gating pulses 149 (FIG. 10) derived from the output of the gating pulse generator 36 (FIG. 2). These pulses have a duration of 3 – 5 μs and coincide in time with the video signal portion in the frame blanking interval within which the noise instantaneous values are sampled. From the output of the gating circuit 35 separated noise packets 150 (FIG. 10) are applied to the input of the video amplifier 37 (FIG. 2). From the output of the video amplifier 37 (FIG. 2) the strongly amplified noise packets 150 (FIG. 10) are applied through the switch 38 to the input of the weighting filter 39 or the weighting filter 40. The filter 39 is connected when the video signal-to-noise ratio is measured in a black-and-white television channel, the filter 40, when the measurement is made in a color television channel. The weighting filters 39 and 40 are disconnected from the measurement channel by means of the bus 41 when the apparatus measures the ratio of the video signal to the non-weighted noise voltage.

Figure 10:
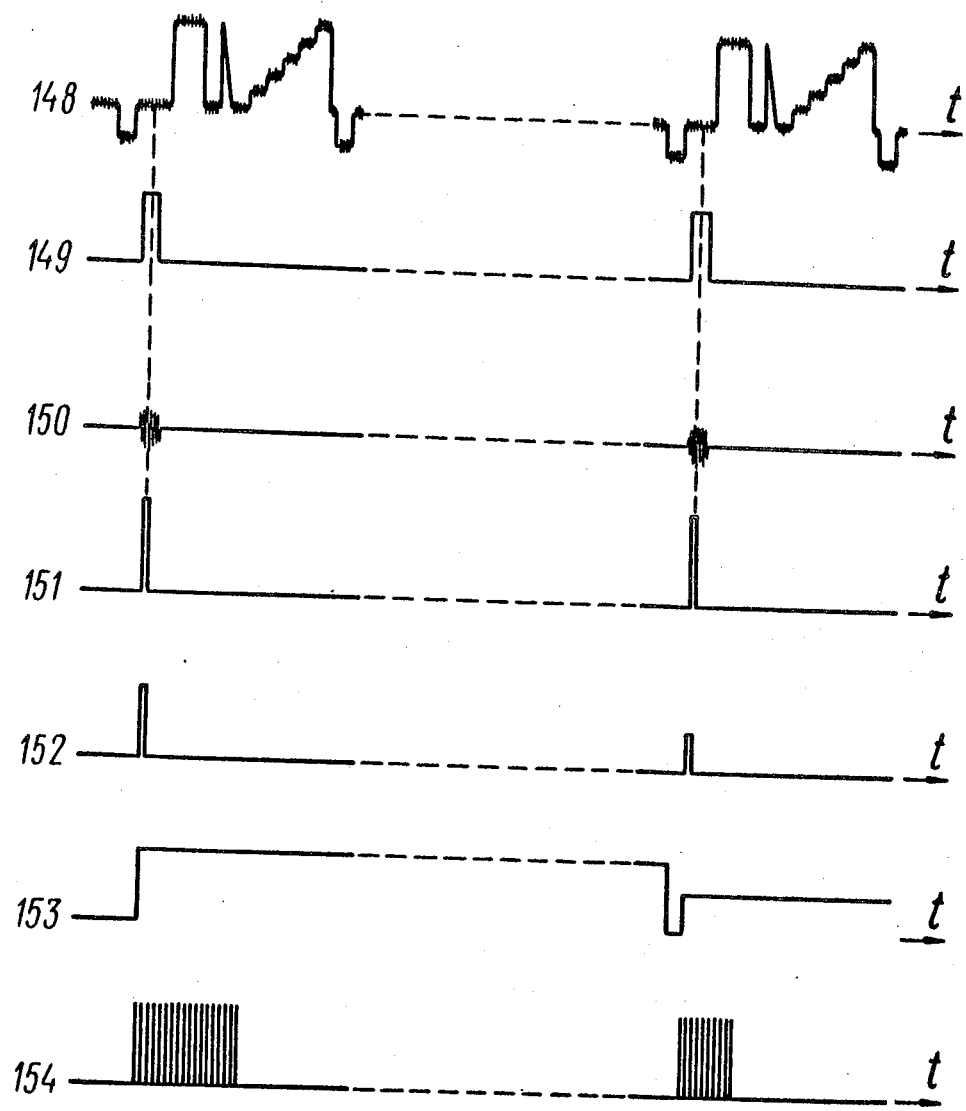
FIG. 10 shows waveforms in various circuits of the apparatus during the noise measurement cycle in the mode $a$, according to the invention.

From the ouput of the filter 39 (or 40), the noise packets 150 (FIG. 10) are applied as a modulating voltage to the input of the pulse amplitude modulator 6 via the output bus 42 (FIG. 1). The other input of the amplitude pulse modulator 6 is fed from the output of the short pulse shaper 5 with short pulses 151 (FIG. 10) of 20–30 ns duration which are repetitive at the field frequency in mode a, at the line frequency in the mode b, at the same frequency in the mode c. The short pulses 151 are produced in the shaper 5 (FIG. 1) so that the coincide with the middle of the noise packets 150 (FIG. 10). The pulse amplitude modulator 6 (FIG. 1) modulates short pulses 151 (FIG. 10) in amplitude with the noise instantaneous values to produce at its output a train of pulses (FIG. 10) modulated in amplitude according to a random law which corresponds to the law of distribution of the noise instantaneous values. In this way the instantaneous values of the noise being measured are discretely sampled. It should be noted that noise may be sampled in the interval of one frame blanking pulse more than once in each field, which reduces the measurement time.

From the output of the pulse amplitude modulator 6 (FIG. 1) the pulses 152 (FIG. 10) are applied through the switch 7 (FIG. 1) to the input of the pulse stretcher 8, which is reset by the pulses applied from the output of the control unit 17. During the noise measurement cycle, the switch 7 connects the input of the pulse stretcher 8 to the output of the pulse amplitude modulator 6. The stretcher 8 stretches the pulses 152 (FIG. 10) to a field period and from the output of the stretcher 8 (FIG. 1) stretched pulses 153 are applied to the input of the means 9 (FIG. 1) for converting the pulse amplitude to the number of pulses, wherein the stretched pulses 153 (FIG. 10) are converted to pulse groups 154. The number of pulses in these groups is proportional to the amplitudes of the corresponding stretched pulses 153 and, consequently, to the instantaneous values of the noise being measured. The rate at which the pulse amplitude is converted to the number of pulses is made sufficiently high to ensure the conversion of the maximum possible noise instantaneous value at the minimum interval between the successive noise samples (in the mode b, when the noise is sampled on each line blanking pulse). From the output of the means 9 (FIG. 1), the pulse groups 154 (FIG. 10) are applied to the input of the means 10 (FIG. 1) for producing the differences between samples.

The means 10 for producing the differences between samples alternately memorizes and subtracts the successive samples of the noise instantaneous values represented by the pulse groups 154 (FIG. 10). From the input bus 61 (FIG. 5), the pulse groups 154 (FIG. 10) are applied to the inputs of the binary pulse counters 64 (FIG. 5) and 65. The counter 64 registers the number of the pulses contained in each group in a direct code and the counter 65 in an inverse code. Before the arrival of the next pulse group, the control circuit 63 clears the counter 64 and the number registered in the counter 64 is rewritten into the counter 64 by means of the rewrite cricuit 66, after which the counter 65 is also cleared. When the next pulse group arrives, the number of pulses contained in this group is registered in the counter 65 in an inverse code, while in the counter 64 this number is subtracted from the number previously rewritten from the counter 65. If during the process of subtraction the zero indication circuit 67 registers zero, the control circuit 64 produces a pulse which renders the switching circuit 62 conductive and pulses are applied from the input bus 61 via the switching circuit 62 to the output bus 70, the number of the pulses being equal to the difference between the number of the pulses contained in the second incoming pulse group and the number of the pulses contained in the first incoming pulse group. If during the process of subtraction the circuit 67 does not register zero, after termination of the second pulse group the control circuit 63 begins to produce pulses similar to the pulses in the incoming groups. These pulses are applied to the second input of the counter 64 and (through the switching 62) to the output bus 70 until the zero indication circuit 67 operates. In this case the number of the pulses which have been applied to the input bus 70 is equal to the difference between the numbers of the pulses contained in the first and in the second pulse groups. The same operations are performed before the third pulse group comes to the input bus 61: the counter 64 is cleared, the number retained by the counter 65 is rewritten into the counter 64, the counter 65 is also cleared, and so on. In this way differences between each two successive noise samples are produced. Simultaneously the video signal strongly correlated from sample to sample is cancelled and the noise which is non-correlated between these samples is geometrically added up.

During the video signal measurement cycle described above, the differences between samples are produced in a similar manner during the comparison between the amplitudes of the reference pulse 128 (FIG. 8) and the white pulse 126 (or the equivalent pulse 129). If the number of pulses in the group 136 which is proportional to the amplitude of the reference pulse 128 exceeds the number of pulses in the group 137 proportional to the amplitude of the white pulse 126, a pulse appears at one of the outputs of the control circuit 63 (FIG. 5). If the number of pulses in the group 136 (FIG. 8) is smaller than the number of pulses in the group 137, a pulse appears at another output of the control circuit 63 (FIG. 5). The pulses appearing at both the outputs of the control circuit 63 are applied via the bus 28 to the inputs of the control signal source 27 (FIG. 3). If the groups 136 and 137 (FIG. 8) have the same number of pulses, no pulses appear at either outputs of the control circuit 63 (FIG. 5) and an equality pulse appears at its third output to be applied to the input of the control unit 17 via the bus 69.

During the noise measurement cycle, a train of pulse groups in which the number of pulses is proportional to the difference between the successive noise samples is applied from the output of the means 10 (FIG. 1) for producing the differences between samples to the input of the analyzer 11 of the differences between samples via the output bus 70. The analyzer 11 of the differences between samples is intended to increase the noise measuring accuracy primarily in the mode c, when noise is sampled in any portion of a video signal from a moving picture in each frame. A higher accuracy of measurement is obtained due to the fact that in the analyzer 11 the pulse groups in which the number of pulses exceeds a definite threshold number proportional to the maximum (practically possible) difference between the successive noise samples are eliminated from the train of the pulse groups corresponding to the differences between the successive noise samples. The threshold number of pulses may be exceeded when the moving picture rapidly changes and the brightness of the picture portion in which the noise is sampled abruptly varies in the interval between the successive samples. In this case, the abrupt variation of the video signal level results in a sharp increase in the difference between the two successive samples and eventually causes an error in the noise measurement.

The analyzer 11 (FIG. 6) of the differences between samples operates as follows.

Before each pulse group arrives from the output of the means 10 via the bus 70, the generator 72 of the threshold number of pulses feeds the reversible pulse counter 76 via the switching circuit 71 with the pulse group containing a threshold number of pulses proportional to the maximum difference between the non-correlated noise instantaneous values. The maximum difference is equal to the quasi-peak value of the noise voltage of the selected level. This level is selected beforehand (prior to the measurements) on the basis of the available data about the anticipated video signal-to-noise ratio in the measured television channel, and the corresponding threshold number of pulses in the group is set at the output of the generator 72 of the threshold number of pulses. This number may be likewise set automatically on the basis of the results of the previous measurements, but it will have to remain unchanged throughout the noise measurement cycle. The threshold number of pulses is registered in the reversible counter 76 which in the given case operates for addition. The pulse group coming from the output of the means 10 is applied via the bus 70 and the switching circuit 71 to the input of the AND circuit 75 and to the input of the reversible counter 76, which in this case begins subtracting. As a result, the number of pulses proportional to the differnce between the successive noise samples is subtracted from the threshold number of pulses. The switching circuit 71 is operated by the pulses which control the mode of operation of the reversible counter 76. These pulses are developed by the control circuit 73 to the input of which control pulses are applied from the output of the control unit 17. If the number of pulses in the pulse group applied to the bus 70 exceeds the threshold number of pulses, the zero indication circuit 77 produces a pulse which is applied to the input of the control circuit 73 and cuts off the AND circuit 75. After the AND circuit 75 is cut off, no more pulses of the pulse group pass through this circuit to the output bus 78 connected to the input of the digital squarer 13 (FIG. 1). Further the pulse developed by the control circuit 73 (FIG. 6) is fed via the bus 82 to the input of the control unit 17 which produces a control pulse. This control pulse resets the digital squarer 13 (FIG. 1) which by this moment has registered the number of the pulses in the group which passed through the AND circuit 75 (FIG. 6) up to the moment the zero indication circuit 77 operates. If the number of the pulses in the pulse group applied to the bus 70 does not exceed the threshold number of pulses, this pulse group fully passes through the AND circuit 75 and is applied to the input of the digital squarer 13 (FIG. 1) via the output bus 78.

The first pulse of each pulse group coming to the output bus 78 actuates the flip-flop 79 which, before the arrival of each pulse group, is reset to the original condition by the control circuit 73. The pulse which appears at the output of the flip-flop 79 is applied through the OR circuit 80 to the input of the counter 81 of the number of differnces, which in this case starts adding. If the number of pulses in some pulse group exceeds the threshold number of pulses, the pulse produced by the zero indication circuit 77 passes through the OR circuit 80 to the input of the counter 81 of the number of differences and is subtracted from the number which is equal to the number of the pulse groups which have come to the output bus 78. In this case, the counter 81 operates for subtraction. Operating as above, the counter 81 of the number of differences registers the number of the pulse groups (differences) which are fully passed through to the input of the digital squarer 13 (FIG. 1) to be subsequently processed for determination of the r.m.s. value of the noise. The counter 81 (FIG. 6) of the number of differences has a preset fixed capacity which is selected depending on the required mode of operation of the apparatus during the noise measurement cycle. As soon as the counter 81 is filled to capacity it produces a pulse which is applied via the bus 82 to the input of the control unit 17 where this pulse is changed into control pulses corresponding to the termination of the noise measurement cycle. If the portion of the video signal wherein the noise being measured is sampled has a constant level (in the frame blanking interval), the analyzer 11 (FIG. 1) of the differences between samples may be switched off by cutting off the corresponding control pulses arriving from the output of the control unit 17 via the bus 74 to the input of the control circuit 73 (FIG. 6). In this case, the AND circuit 75 conducts all the time and all pulse groups coming to the bus 70 pass through the switching circuit 71, the AND circuit 75 and the output bus 78 to the input of the digital squarer 13. Further the counter 81 of the number of differences is disconnected and the required number of differences is set directly in the control unit 17 (FIG. 1).

The pulse groups which correspond to the differences between the successive noise samples which do not exceed the maximum difference are applied from the output of the analyzer 11 of the differences between samples to the input of the digitial squarer 13 via the output bus 78. The digital squarer 13 squares the number of pulses contained in each of the pulse groups mentioned above. From the output of the digital squarer 13 the pulses corresponding to the squares of the differences are applied to the input of the digital integrator 14 which adds up the preset number of squared differences between the successive noise samples. This number is selected beforehand depending on the required mode of operation during the noise measurement cycle and corresponds to the present capacity of the counter 81 of the number of differences (FIG. 6)

or is set directly in the control unit 17 (FIG. 1). The output pulses of the digital integrator 14 which correspond to the accumulated sum of the squared differences are applied to the input of the digital logarithmic circuit 15 which computes the logarithm of this sum. The logarithmic computation takes into account the coefficient ½ which corresponds to the operation of square root extraction necessary for finding the r.m.s. value of the noise, and the coefficient 20 necessaary for measuring the video signal-to-noise ratio in decibels. The output pulses of the digital logarithmic circuit 15 corresponding to the r.m.s. value of the noise are applied to the input of the digital display 16 which indicates in decibels the measured ratio of the peak-to-peak amplitude of the video signal to the r.m.s. value of the noise. The pulses applied to the input of the digital display 16 may be also fed to an external digital printer furnishing the measurement results in a printed form.

In order to indicate the picture detail on which the noise level is measured, a video signal with an inserted bright mark pulse may be fed to the input of a picture monitor from the output 155 of the sync separator 3.

The control unit 17 furnishes pulses, which set the duration and alternation of the measurement cycles, synchronize the operation of the individual units and control operation of the entire apparatus. The switch 101 (FIG. 7) is used to select the required mode of operation of the apparatus during the noise measurement cycle (one from the modes a, b, and c mentioned above). As a result, the negative terminal of the DC voltage source 102 is connected via the switch 101 to the respective bus 98, 99 or 100, and DC voltage is fed via the output bus 97 to the second input of the sync separator 3 (FIG. 1).

From the fourth output of the sync separator 3 field sync pulses are applied via the input bus 83 to the first input of the control unit 17. These pulses are applied via the bus 84 (FIG. 7) to the input of the flip-flop 85 operating in the counter triggering mode and trigger it. The pulses appearing at both outputs of the flip-flip 85 are repetitive at the frame frequency.

The process of automatic measurement of the video signal-to-noise ratio is started by pressing the start button 103. As a result, the pulse from the first output of the flip-flop 85 passes via the closed contacts of the button 103 and through OR circuit 104 to the first input of the flip-flop 105 operating in the reset-set triggering mode. The flip-flop 105 flips and produces at its first output a corresponding voltage drop which via the bus 107 and the output bus 26 comes to the second input of the switch 25 (FIG. 2) of the unit 2 measuring the peak-to-peak amplitude of the video signal, and also comes to the third input of the switch 7 (FIG. 1) via the output bus 106 and to the third input of the AND-OR circuit 90 (FIG. 7). This voltage drop is a control signal corresponding to the commencement of the video signal measurement cycle. As a result, the switch 7 (FIG. 1) connects via the bus 29 the first input of the pulse stretcher 8 to the first output of the control signal source 27 (FIG. 2), and the switch 25 connects via the bus 43 the output of the addition circuit 20 to the first input of the source 27, resulting in the video signal 124 (FIG. 8) arriving at the said input.

The sync pulse of the test line containing the white pulse 126 and the sync pulse of the preceding line from the input bus 83 (FIG. 7) are applied via the buses 86 and 88 to the inputs of the multivibrators 87 and 89, respectively. The pulses produced by the multivibrators 87 and 89 have a different duration defined so, that the trailing edge of these pulses corresponds to the required time positions of the gating pulses 131 (FIG. 8). The pulses from the outputs of the multivibrators 87 and 89 (FIG. 7) are passing in turn in each next field through the AND-OR circuit 95 and arrive via the bus 96 and the output bus 26 to the second input of the control signal source 27 (FIG. 3) for triggering the generator 45 of the gating pulses 131 (FIG. 8). From the respective outputs of the flip-flop 85 the pulses repetiting at the frame frequency are fed to two other inputs of the AND-OR circuit 95 (FIG. 7).

The sync pulse of the preceding line is also applied via the bus 88 to the first input of the AND-OR circuit 90. The pulse from the output of the AND-OR circuit 90 is applied via the output bus 112 for voltage resetting at the second input of the pulse stretcher 8 (FIG. 1) and via the output bus 68 to the third input of the control circuit 63 (FIG. 5) of the means 10 for producing the differences between samples. Further the pulse from the output of the AND-OR circuit 90 (FIG. 7) is applied to the input of the multivibrator 113 and triggers it. The multivibrator 113 produces a control pulse fed via the output bus 114 to the second input of the means 9 (FIG. 1) for converting the pulse amplitude to the number of pulses.

At the moment the video signal measurement cycle terminates the equality pulse is fed from the output of the control circuit 63 (FIG. 5) via the bus 69 to the input of the multivibrator 108 (FIG. 7). The multivibrator 108 produces a control pulse corresponding to termination of the video signal measurement cycle and to the commencement of the noise measurement cycle. This pulse from the output of the multivibrator 108 is fed to the second input of the flip-flop 105, to the first input of the binary counter 109, via the output bus 110 to the second input of the digital integrator 14 (FIG. 1) and via the output bus 111 to the second input of the digital logarithmic circuit 15. The flip-flop 105 (FIG. 7) again flips, and a corresponding voltage drop from its second output is fed to the second input of the AND circuit 94 and to the fourth input of the AND-OR circuit 90. At the same time the reverse voltage drop appearing at the first output of the flip-flop 105 is fed via the buses 107 and 26 to the second input of the switch 25 (FIG. 2), and via the bus 106 (FIG. 1) to the third input of the switch 7. As a result, the switch 7 connects the output of the pulse amplitude modulator 6 with the first input of the pulse stretcher 8, and the switch 25 (FIG. 2) connects the output of the addition circuit 20 with the input of the video amplifier 30. The sync pulse of the line preceding the line selected for the noise measurement is fed from the output bus 83 (FIG. 7) via the bus 91 to the second input of the AND-OR circuit 90. The pulse from output of the AND-OR circuit 90 is fed like in the video signal measurement cycle to the respective inputs of the pulse stretcher 8 (FIG. 1), the means 10 and the multivibrator 113 (FIG. 7) producing a control pulse for means 9 (FIG. 1).

The sync pulse of the preceding line is fed also via the bus 91 (FIG. 7) to the first inputs of the AND circuit 94 and the OR circuit 92, and to the input of the multivibrator 93 producing a pulse, the trailing edge of which leads by 2—3 μs the leading edge of the second pulse of the train 140 (FIG. 9) of the paired pulses. The pulse from the output of the multivibrator 93 (FIG. 7) is applied to the second input of the OR circuit 92. The pulse appears at the output of the OR circuit 92 is applied via the output bus 33 for the voltage reseting to the second input of the pulse stretcher 56 (FIG. 4) of the cancelling voltage source 32.

The output pulse of the AND circuit 94 (FIG. 7) is applied via the bus 115 and the output bus 116 to the second input of the digital squarer 13 (FIG. 1). Further the output pulse of the AND circuit 94 (FIG. 7) may be applied through the switch 117 to the output bus 74 or to the second input of the binary pulse counter 109, if the analyzer 11 (FIG. 1) of the differences between samples is not used.

In the beginning of the noise measurement cycle the binary counter 109 (FIG. 7) is set in initial condition by means the pulse applied to its first input from the output of the multivibrator 108. Counter 109 divides the number of pulses arriving from the output of the AND circuit 94 through the switch 117 and repetiting in the mode $a$ at the frame frequency. The division factor of the counter 109 is set so that the pulse at the output of the counter 109 appears at the moment when the number of pulses equal to the selected number of the differences between the successive noise samples has arrived to its input. This time moment corresponds to the termination of the noise measurement cycle. The output pulse of the counter 109 is applied through OR circuit 118 to the second input of the OR circuit 104, and via the output bus 123 to the second input of the digital display 16 (FIG. 1). As a result, the number equal to the measured in decibels ratio of the peak - peak amplitude of the video signal to the r.m.s. value of the noise appears at the digital display 16. This number remains unvariable during the next entire period of the measurement of said ratio (till the termination moment of the noise measurement cycle in the next period). The next period of the measurement starts automatically after the output pulse of the counter 109 (FIG. 7) has passed through the OR circuits 118 and 104 and arrived to the first input of the flip-flop 105.

If the video signal-to-noise ratio is required to be measured using the analyzer 11 (FIG. 1) of the differences between samples, the switch 117 (FIG. 7) is set in corresponding position. As a result, the pulse from the output of the AND circuit 94 is applied via the output bus 74 to the first input of the control circuit 73 (FIG. 6) of the analyzer 11 of the differences between samples. If the number of pulses in the pulse group arriving to the input bus 70 of the analyzer 11 exceeds the threshold number of pulses, the control circuit 73 produces the pulse which is applied via the buses 82 and 120 (FIG. 7) to the input of the multivibrator 121. The pulse appeared at the output of the multivibrator 121 is applied via the bus 122 and the output bus 116 to the second input of the digital squarer 13 (FIG. 1) to reset the squarer 13 in the initial condition. The number of pulse groups fully passed from the output of the analyzer 11 of the differences between samples via the bus 78 to the first input of the digital squarer 13 is registered in the counter 81 (FIG. 6) of the number of differences. As soon as the counter 81 is filled to its capacity it produces a pulse which is applied via the buses 82 and 119 (FIG. 7) to the second input of the OR circuit 118. This time moment corresponds to the termination of the noise measurement cycle.

The apparatus for automatic measurement of the video-signal-to-noise ratio in a television channel provides highly accurate atuomatic digital measurement of the video signal-to-noise ratio in various sections of a television channel during the television program transmission. The apparatus also provides measurement of the video signal-to-noise ratio in the intervals in the television program transmission when a test chart signal or standard test signals are transmitted over a television channel.

In accordance with the international recommendations and regulations, the apparatus measures in decibels the ratio of the peak-to-peak amplitude of the video signal between the reference black and white levels to the true r.m.s. value of the noise within the video frequency band. The apparatus can measure the ratio of the video signal to both the weighted and unweighted noise.

The apparatus can be used as a self-contained measuring instrument in the development, alignment and operation of various television equipment. The apparatus may be also included in an integrated monitoring system and in systems for automatic remote monitoring of television channels of satellite, radio-relay and cable communication links and the video channels of television stations.

A high sensitivity of the apparatus which is due to the processions for preliminary processing of the video signal enables measurement of high video signal-to-noise ratios (up to 7 db) in individual sections of a communication link.

Due to the fact that the apparatus realizes direct digital processing of the noise samples, it allows the video signal-to-noise ratio to be measured with an error not greater than ±1 db by the same digital method both in the television channel of a communication link (in the blanking pulse interval) and in the video channel of a television center (in the picture signal interval) during the transmission of still and moving images. Measurements may be made in any uniform portion of a video signal of black-and-white television (and the primary video signals of color television) corresponding to any pictorial detail the length of which not less than 0.04 of the line length in the horizontal direction and which may be as small as the width of one line in the vertical direction. The possibility of measuring the video signal-to-noise ratio on practically any pictorial detail regardless of its size and brightness enables quick and highly accurate mesurement of the inherent noise of any video signal source (a television camera, a television projector, a video tape recorder and its individual heads, and other sources).

As the apparatus produces and analyzes the differences between the successive noise samples the accuracy of noise measurements is rendered unaffected by the variation of the video signal levels, periodic interference, power supply hum and the spurious signals of the video signal sources, which fact account for a high accuracy of the measurements.

What we claim is:
1. An apparatus for automatic measurement of the video signal-to-noise ratio in a television channel, said apparatus comprising:
 a control unit having inputs and outputs;
 means for measuring the peak-to-peak amplitude of a video signal, said measuring means having inputs and outputs, a first input of said measuring means being supplied with the video signal, a second input of said measuring means being connected to a first output of said control unit;
 a sync separator having inputs and outputs, a first input thereof being supplied with the video signal and a second input thereof being connected to a second output of said control unit, a first output of said sync separator being connected to a first input of said control unit, a second output of said sync separator being connected to a third input of said measuring means;

a short pulse shaper having an input thereof connected to a third output of said sync separator;

pulse-amplitude modulator means for modulating short pulses with the video signal, said modulator means having a first input thereof connected to an output of said short pulse shaper;

a pulse stretcher having two inputs and an output, the first input thereof being coupled to an output of said modulator means and the second input thereof belong connected to a third output of said control unit;

means for converting pulse amplitude to a number of pulses, said converting means having two inputs and an output, the first input thereof being connected to the output of said pulse stretcher and the second input thereof being connected to a fourth output of said control unit;

means for producing a difference between samples so that each next sample is substracted from the previous one, said means for producing the difference between samples having two inputs and three outputs, the first input thereof being connected to the output of said converting means and the second input thereof being connected to a fifth output of said control unit, the first output thereof being connected to the third input of said measuring means.

a function generator including a digital squarer, a digital integrator and a digital logarithmic circuit, said function generator being controlled by said control unit and having an input thereof coupled electrically to the second output of said means for producing a difference between samples, said means for producing the difference between samples, said digital squarer of said function generator having a first input thereof connected to a sixth output of said control unit and a second input thereof coupled electrically to the second output of said means for producing the difference between samples, said digital integrator of said function generator having a first input thereof connected to a seventh output of said control unit and a second input thereof connected to an output of said digital squarer, said digital logarithmic circuit of said function generator having a first input thereof connected to an eighth output of said control unit and a second input thereof connected to an output of said digital integrator; and a digital display having a first input thereof connected to an output of said logarithmic circuit and a second input thereof connected to a ninth output of said control unit.

2. An apparatus as claimed in claim 1, further comprising: a video-signal pre-processing unit having three inputs and an output, the first input thereof being connected to a fourth output of said sync separator, the second input thereof being connected to a first output of said measuring means so as to separate noise packets from the video signal and to amplify them, the third input thereof being connected to a tenth output of said control unit, the output of said video-signal preprocessing unit being connected to a second input of said pulse-amplitude modulator means so as to supply noise packets to the second input of said modulator means; and a switch connected between a second output of said measuring means and the first input of said pulse stretcher, said switch having a second input thereof connected to the output of said pulse amplitude modulator means and a third input thereof connected to an eleventh output of said control unit.

3. An apparatus as claimed in claim 2, further comprising and analyzer of the difference between samples which is connected between the second output of said means for producing the difference between samples and the second input of said digital squarer, said analyzer having inputs and outputs, the second output thereof being connected to a second input of said control unit and the second input thereof being connected to a twelvth output of said control unit, a third input of said control unit being connected to a second output of said means for producing the difference between samples, thereby to enable automatic measurements of the video signal-to-noise ratio on a moving picture.

* * * * *